SEMICONDUCTOR DEVICE COMPLEX

Filed July 25, 1961 4 Sheets-Sheet 1

INVENTOR.
DAVID F. ALLISON

BY

Lippincott, Ralls & Hendricson
ATTORNEYS

INVENTOR.
DAVID F. ALLISON
BY
Lippincott, Ralls & Hendricson
ATTORNEYS

INVENTOR.
DAVID F. ALLISON
BY
Lippincott, Ralls & Hendricson
ATTORNEYS

INVENTOR.
DAVID F. ALLISON
BY
Lippincott, Ralls & Hendricson
ATTORNEYS

United States Patent Office 3,303,400

Patented Feb. 7, 1967

3,303,400

SEMICONDUCTOR DEVICE COMPLEX

David F. Allison, Palo Alto, Calif., assignor to Fairchild Camera and Instrument Corporation, Syosset, N.Y., a corporation of Delaware Filed July 25, 1961, Ser. No. 126,600
3 Claims. (Cl. 317—235)

This invention relates to semiconductor devices, particularly transistors, and its chief object is to provide improved structures and methods of fabrication for increasing the percentage yield of acceptable devices manufactured.

In the manufacture of transistors and the like, e.g., by the diffusion of impurities into a monocrystalline body of semiconductor to form layers of differing conductivity types therein, a predictable percentage of the units fabricated are defective, due to imperfections in the crystal or other causes. In general, as the area of the p-n junctions between adjacent layers is increased, there is a corresponding increase in the probability that a defect will be included that will cause the device to be defective. Hence, in the manufacture of high-power transistors, wherein relatively large junction areas are required to meet the power requirements, the yield of acceptable transistors from a manufacturing process is especially likely to be so low that the manufacturing cost is seriously increased.

According to this invention, a large-area transistor, or other semiconductor device, is made from a number of similar, relatively small, functional subunits connected in parallel. The number of similar subunits provided within a single structure or complex exceeds the minimum number of such subunits required, and any defective subunits, internally shorted subunits in particular, are effectively disconnected from the circuit—that is, at least one of the connections to each defective subunit is opened, so that these subunits have no harmful effects on functioning of the other subunits. Thus, an acceptable complex may be fabricated even though some of the individual subunits are defective, and the manufacturing yield may be increased spectacularly, with consequent cost reductions.

Several methods are useful for disconnecting the defective subunits. According to one method, all of the subunits are initially connected together by metal-film leads, and, after testing, one or more connections to defective subunits are broken by removing a portion of the metal film. According to another method, a complex is tested and classified before the subunits are connected together, and then the good subunits are connected by printed-circuit leads, applied in a pattern determined by the test classification. According to still another method, all of the subunits are connected by leads formed with built-in fuses, whereby shorted subunits are automatically disconnected from the circuit by the flow of excessive current to the defective subunit, which "blows the fuse" in one or more leads connected to that subunit.

Similar problems arise in the fabrication of circuit complexes comprising a plurality of transistors, or other semiconductor devices, within the same body, e.g., within a single piece of semiconductor crystal. Heretofore, one of the chief difficulties in the fabrication of such complexes has been the low yield of acceptable complexes. According to the present invention, the number of similar devices provided in a complex exceeds the minimum number of such devices required, and circuit connections are provided in a pattern that excludes defective units.

The invention may be understood better from the following illustrative description and the accompanying drawings.

FIG. 1 of the drawings is a greatly enlarged, schematic plan view of a power transistor fabricated of interconnected subunits in accordance with the present invention.

Figure 10:
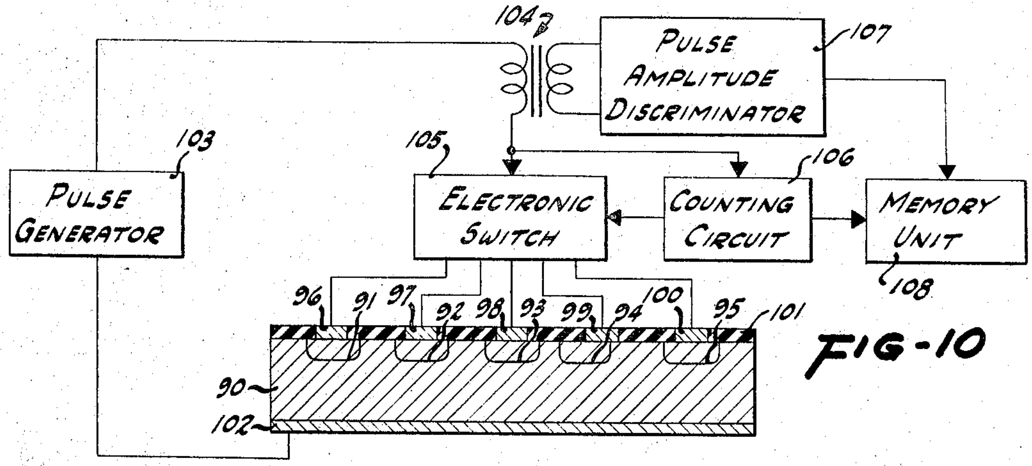
Figure 11:
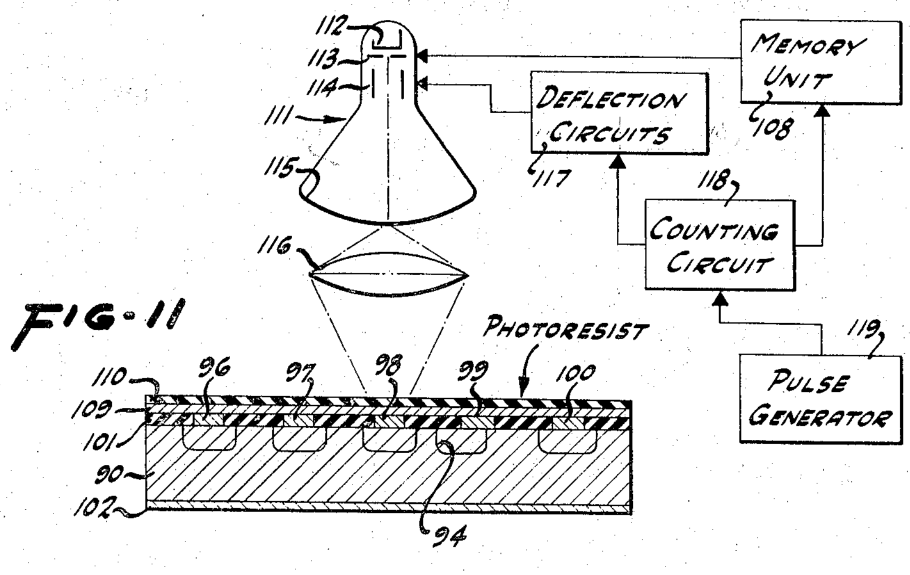
Figure 12:
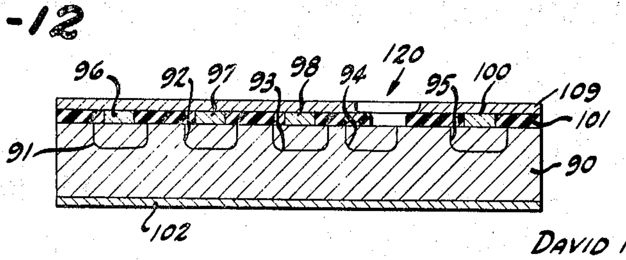

FIGS. 10, 11 and 12 illustrate automated testing and selective interconnection of a multiple-unit diode, the size of the diode relative to the other equipment being greatly exaggerated for clarity of illustration; FIG. 10 being a schematic block diagram of the testing apparatus employed; FIG. 11 being a schematic block diagram of photoengraving apparatus employed; and FIG. 12 being a schematic, greatly enlarged section view of the selectively interconnected, multiple-unit diode.

Figure 1:
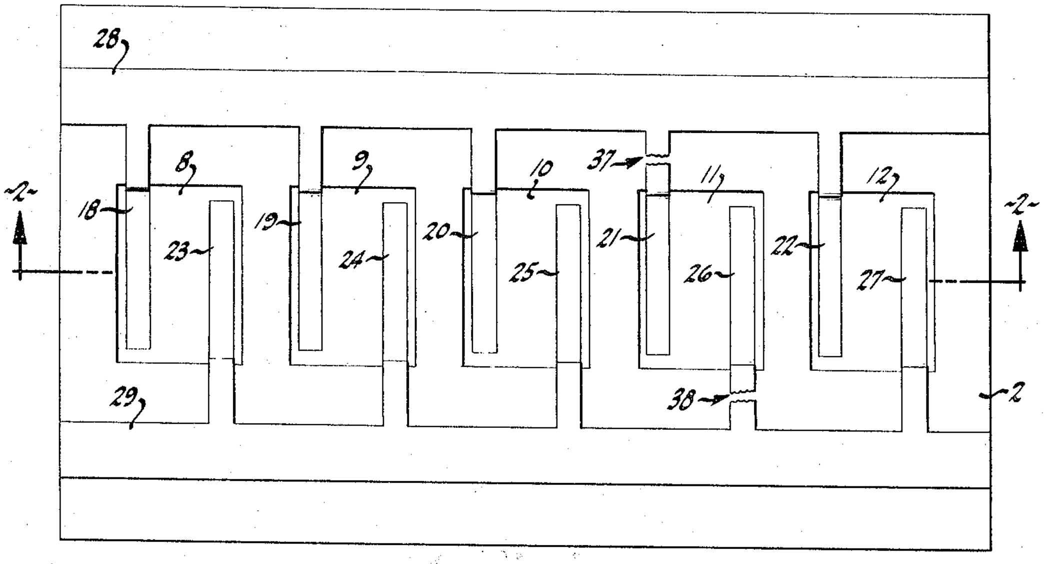
Figures 2, 3:
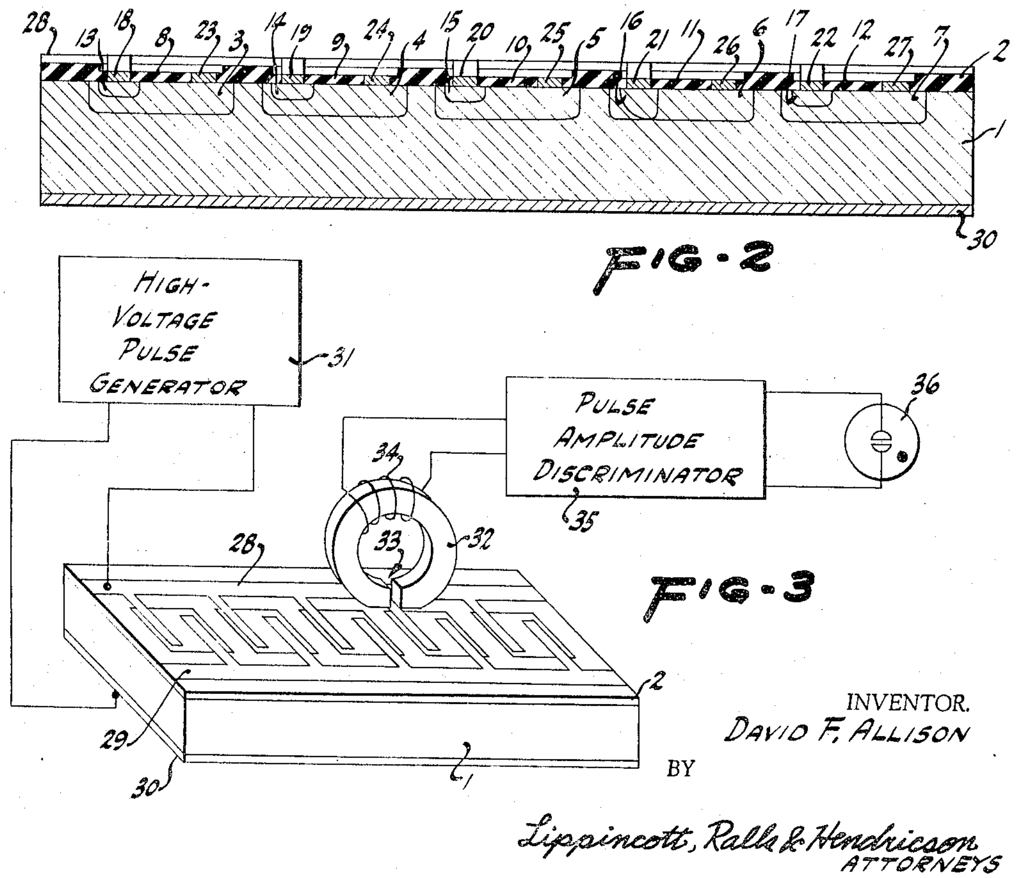
FIG. 2 is a section taken along the line 2—2 of FIG. 1.
FIG. 3 is a schematic view illustrating a test procedure for locating defective subunits that are already interconnected.

Referring to FIGS. 1 and 2, the power transistor illustrated is fabricated from a monocrystalline body 1 of semiconductor, e.g., silicon. The bulk of body 1 (which constitutes the collector) may be either n-type or p-type conductivity, depending on whether an n-p-n or a p-n-p transistor is desired. The top of body 1 is mostly covered by an oxidized layer 2, which protects the surface, acts as a mask for diffusing impurities into the crystal to form the desired base and emitter junctions, and, finally, acts as an insulating layer on which metal-film leads can be deposited without shorting the transistor junctions. Layer 2 is formed by oxidizing the surface of the semiconductor, e.g., by heating in the presence of oxygen.

In the manufacture of this transistor complex by previously known diffusion techniques, holes are etched through the oxidized layer 2, and an appropriate impurity is diffused into the crystal, through these holes, to form five separate base layers 3, 4, 5, 6 and 7 of opposite conductivity type to the bulk of body 1. For this purpose any impurity may be used that will reverse the conductivity type of the semiconductor and that does not readily penetrate the oxidized layer used as a mask to define the separate base layers. Those skilled in the art are already familiar with such impurities and the process of transistor fabrication by diffusing through an oxide mask, and therefore this part of the process requires no further description.

During diffusion of the base layers, the surface of the semiconductor re-oxidizes to form somewhat thinner oxide layers 8, 9, 10, 11 and 12 within the holes employed for base-layer diffusion. Next, five holes are etched through the re-oxidized layers and emitter layers 13, 14, 15, 16 and 17 are formed within the five base layers by a similar process of diffusing an appropriate impurity through the holes in the oxide. Metal-film electrodes 18, 19, 20, 21 and 22 are deposited through the five holes in the oxide onto the five emitter layers of the transistor complex, and metal-film electrodes 23, 24, 25, 26 and 27 are applied through five additional holes etched through the oxide in contact with the five base layers of the transistor complex. Lead 28, connecting the five emitter contacts in parallel, and lead 29, connecting the five base contacts in parallel, are applied on top of the insulating oxide layer 2 by depositing a metal film through an appropriately shaped mask, or by applying a metal coating over the entire surface and removing unwanted metal by engraving, or by any other appropriate means. A collector contact 30 is formed by cleaning the bottom surface of body 1 and covering it with a metal coating.

In the manner described, there is formed a transistor complex consisting of five similar functional subunits, each having a separate emitter and base, all five subunits having the same collector. Initially, the five subunits may all be connected together by the leads 28 and 29; but the fourth subunit from the left is defective, its emitter and collector being shorted, e.g., by a defect inside the semiconductor crystal, as is represented schematically in FIG. 2 by the emitter layer 16 extending all of the way through base layer 6. This defect can be discovered by testing in the manner schematically illustrated in FIG. 3.

Referring to FIG. 3, a high-voltage pulse generator 31 is connected to apply voltage pulses between emitter lead 28 and collector contact 30. These voltage pulses cause a relatively large current flow through the defective subunit. This abnormally large current flow can be detected by any current-measuring instrument capable of being used without breaking the circuit. By way of example, this may be an instrument that measures the magnetic field produced by the current flow, comprising a small magnetic core 32 provided with a gap 33, which can be placed adjacent to the conductor so that a considerable part of the magnetic flux produced by the current flow passes through the magnetic core, a winding 34 upon the core in which is induced a voltage pulse proportional to the current pulse flowing in the conductor, a pulse-amplitude discriminator 35 (together with amplifiers as required), adjusted to transmit only pulses of abnormally large amplitude associated with an abnormally large current flow, and an indicating device 36, e.g., a neon lamp, which signals the presence of the abnormally large pulses transmitted by the amplitude discriminator. When the magnetic core 32 or probe is placed over a lead to each transistor subunit in turn, indicator 36 signals the detection of abnormal current which indicates a shorted subunit. The defective subunit can then be disconnected from the other subunits by breaking one or more of the metal-film leads to the defective subunit, as illustrated at 37 and 38 in FIG. 1. The leads are easily broken by scratching away a portion of the metal film with any sharp instrument. By this means, defective subunits in the complex have no harmful effect upon the functioning of other subunits. Although certain types of defects may not be discovered by the test described—e.g., where the defect is an open circuit instead of a short circuit—such defects are of relatively infrequent occurrence, and even when present are unlikely to have a harmful effect upon the functioning of the nondefective subunits.

Figure 4:
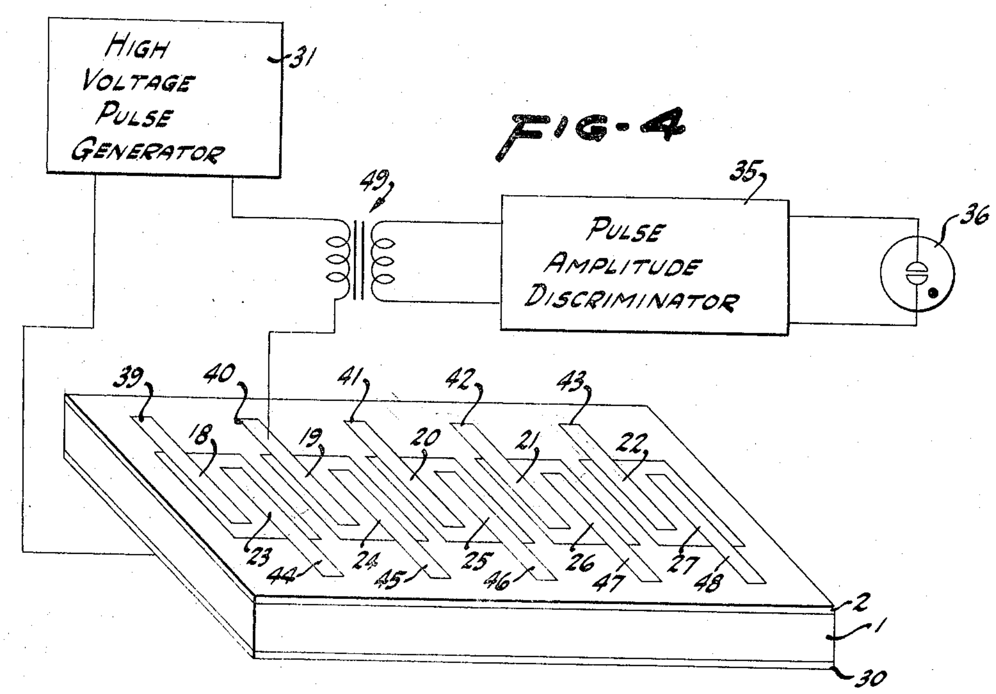
FIG. 4 is a schematic illustration of a test procedure for locating defective subunits prior to their interconnection.

FIG. 4 illustrates the testing of the subunits prior to their interconnection. Instead of applying the interconnecting leads 28 and 29 before testing, as in FIGS. 1, 2 and 3, the complex illustrated in FIG. 4 comprises five stub leads 39, 40, 41, 42 and 43, each connected to a different one of the five emitter contacts, and five other stub leads 44, 45, 46, 47 and 48, each connected to a different one of the five base contacts. At this stage of fabrication, the stub leads are not connected together—hence, the high voltage pulse generator 31 can be connected between the common collector contact 30 and each of the stub leads in turn, particularly the five stub leads connected to the five emitter contacts, thereby testing in turn each of the five transistor subunits within the complex. In fact, the purpose of the stub leads is to facilitate testing and the subsequent interconnection of nondefective subunits; the stub leads could be omitted and their functions performed by the contacts.

Figure 5:
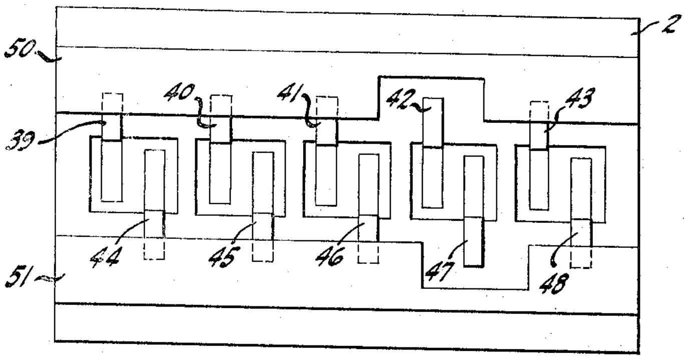
FIG. 5 is a schematic illustration of printed-circuit interconnections omitting a defective subunit.

As each subunit is tested, pulses proportional to the current through that subunit are transmitted by transformer 49 to pulse amplitude discriminator 35, which is so adjusted that abnormally large pulses light indicator lamp 36. The complexes can be sorted in accordance with the results of this test—i.e., those with no defective subunits can be placed in one group, those with the first subunit from the left defective and all others good can be placed in a second group, etc. Each group can then have applied thereto a different pattern of interconnections for connecting together the good subunits, while omitting the defective subunits. For example, FIG. 5 illustrates one of the group in which only the fourth subunit from the left is defective. Metal-film lead 50 is applied in a pattern which overlaps, and thereby interconnects, the stub leads 39, 40, 41 and 43 connected to the emitters of good subunits, while avoiding connection to the stub lead 42 from the emitter of the defective unit. Similarly, a metal-film lead 51 is applied in a pattern that overlaps and interconnects the stub leads 44, 45, 46 and 48 connected to the base contacts of the good subunits, but not the stub lead 47 connected to the base contact of the defective subunit.

Figure 6:
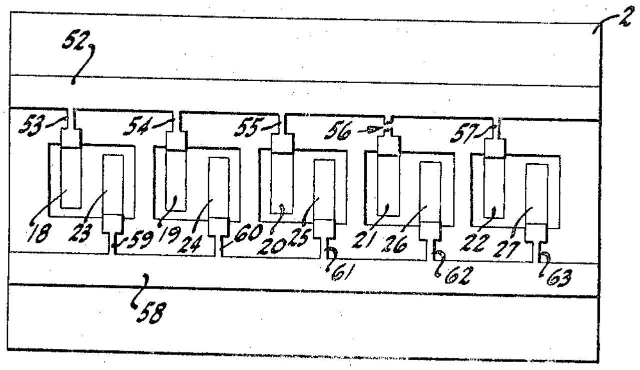
FIG. 6 is a schematic plan view of a power transistor made up of subunits interconnected through fused leads that automatically disconnect shorted subunits.

In the embodiment illustrated in FIG. 6, the metal-film lead 52 is connected to the five emitter contacts 18, 19, 20, 21 and 22 through five connections of reduced cross-section, 53, 54, 55, 56 and 57, which act as fuses. Similarly, metal-film lead 58 is connected to the five base contacts 23, 24, 25, 26 and 27 through connections of reduced cross-section 59, 60, 61, 62 and 63, which also act as fuses. The fuses may be of the same metal as the other parts of the leads, but of reduced cross-section, as indicated, or they may be of a different metal having a lower melting point—the only requirement is that the fuses be designed to carry the normal current drawn by the subunits to which they connect, and to "blow," melt, or burn out, when subjected to the abnormally large current drawn by an internally shorted subunit under high-voltage test. In the example illustrated in FIG. 6, it is assumed that there is a short between the emitter and collector in the forth subunit from the left. Hence, when this complex was tested by applying high-voltage pulses between emitter lead 52 and the collector contact, the fuse at 56 melted and effectively disconnected the defective subunit from the circuit.

Figure 7:
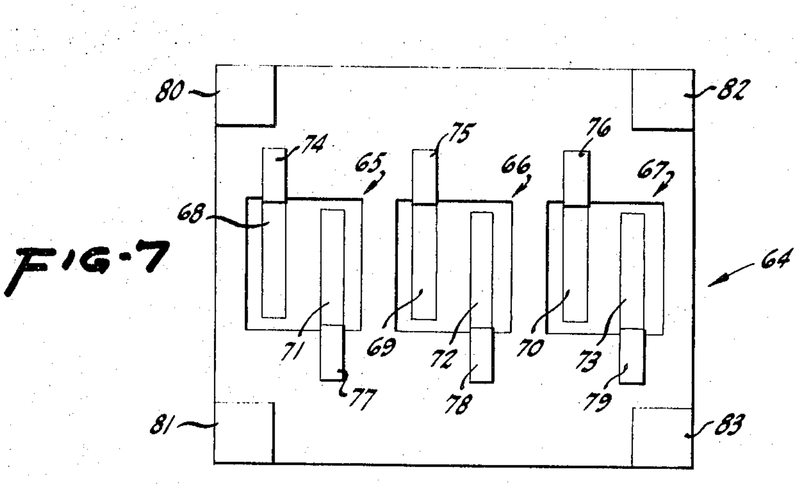
FIG. 7 is a schematic plan view of a complex of three transistors prior to the application of printed-circuit leads for connecting the best two of the three transistors to four circuit terminals.

FIG. 7 represents a body 64 of monocrystalline semiconductor, e.g., silicon, in which three transistors 65, 66 and 67 have been formed by diffusion in the manner hereinbefore described. The three transistors have separate emitter contacts 68, 69 and 70, and separate base contracts 71, 72 and 73. A common collector contact may be coated on the back side in the manner illustrated in FIG. 2. All of the top surface that is not occupied by the emitter and base contacts is preferbaly covered by an insulating oxidized layer, as hereinbefore explained. To facilitate testing and subsequent interconnection, stub leads 74, 75 and 76 are provided in connection with the three emitter contacts, and stub leads 77, 78 and 79 are provided in connection with the three base contacts. Terminals for connection to external circuits may be formed by depositing patches of metal film on top of the insulating oxide layer as illutrated at 80, 81, 82 and 83.

The three-transistor structure illustrated in FIG. 7 may be fabricated for use in circuits requiring two transistors of closely matched characteristics. Even when the two transistors are formed within the same body of semiconductor crystal at the same time, there is a chance of their characteristics not being sufficiently identcal to meet the specifications. The odds are much better that at least two of the three transistors in the complex illustrated will have satisfactorily matching characteristics . At the stage of fabrication illustrated in FIG. 7, the characteristics of the three transistors 65, 66 and 67 can be tested in a conventional manner, and the two transistors having characteristics that match most closely can be selected. Connecting leads are then applied from the four terminals 80, 81, 82 and 83 to the four stub leads connected with the base and emitter contacts of the two selected transistors.

Figure 8:
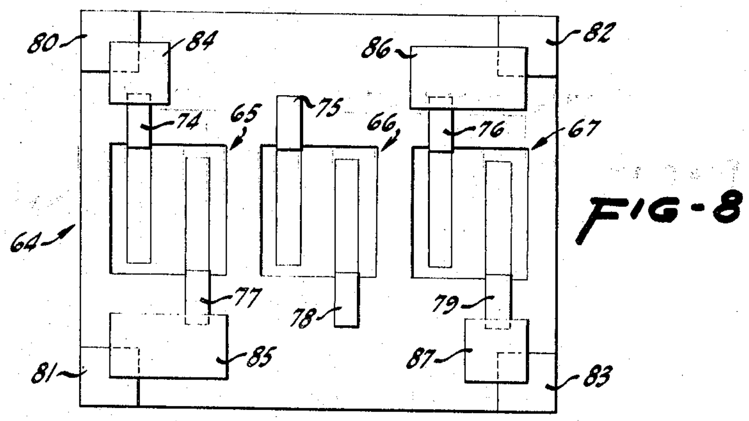
FIG. 8 is a schematic plan view of the same three-transistor complex, after the application of printed-circuit leads connecting the two end transistors of the complex to the four circuit terminals.

FIG. 8 illustrates how the connections may be completed in case the two end transistors 65 and 67 are selected as having the most closely matching characteristics. Metal films 84, 85, 86 and 87 are applied in a pattern connecting stub lead 74 to terminal 80, stub lead 77 to terminal 81, stub lead 76 to terminal 82, and stub lead 79 to terminal 83.

Figure 9:
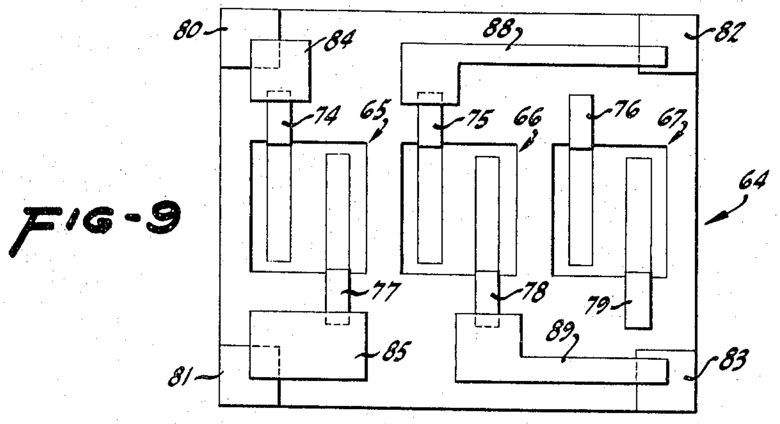
FIG. 9 is a schematic plan view of the same three-transistor complex, after the application of printed-circuit leads connecting one end transistor and the center transistor of the complex to the four circuit terminals.

FIG. 9 illustrates how the connections may be completed in case the two transistors selected are one end unit 65 and the middle unit 66. Metal films 84 and 85 are applied in the same pattern as in FIG. 8 for connecting the emitter and base contacts of transistor 65 to terminals 80 and 81. Metal films 88 and 89 are applied in a pattern that connects the emitter and base contacts of the middle transistor 66 to terminals 82 and 83.

From the foregoing, the pattern to be used for connecting transistors 66 and 67 to the four terminals is obvious, and need not be described. It is also evident that the third transistor, although not suitable for use as one of the closely matched pair, may be useful elsewhere in a circuit, and connections to it may be provided for this purpose.

It will be noted that the two selected transistors are always connected to the same four terminals 80, 81, 82 and 83, and therefore all completed complexes are interchangeable with one another, irrespective of which two out of the three transistor units were selected for use. Hence, the units need to be treated differently only during the single manufacturing step at which the interconnecting films 84–89 are applied.

Referring to FIG. 10, a monocrystalline body of semiconductor 90 is formed into a multiple-unit diode by diffusing an appropriate impurity into selected areas of its upper surface to form a plurality of p-n junctions 91, 92, 93, 94 and 95, as illustrated. Separate contacts 96, 97, 98, 99 and 100 are applied to the semiconductor above the junctions, and the remainder of the surface is covered with a protective and insulating oxidized layer 101. The other side of the body of semiconductor is covered by the contact 102. This structure forms a complex of five separate diode subunits. In the complex illustrated, junction 94 is shorted by contact 99, and therefore the fourth subunit from the left is defective.

When all of the top-side contacts 96, 97, 98, 99 and 100 are connected together, the five p-n junctions are connected in parallel and form a relatively large-area semiconductor diode which, in the example illustrated, is defective because the junction 94 is inadvertently shorted by the contact 99. Hence, for the diode to be useful, it is necessary that the top-side contacts of non-defective subunits only shall be connected together.

FIGS. 10, 11 and 12 are schematically illustrative of the steps in a process for automated testing of subunits to locate defects, and final interconnection of good units only. In all of the figures, the testing and other equipment is represented schematically, and the size of the diode is greatly exaggerated for clarity of illustration.

As illustrated in FIG. 10, a pulse generator 103 is connected to the bottom-side contact 102, and is connected to the top-side contacts 96–100 through the primary of transformer 104 and an electronic switch 105, which is operable to connect the pulse generator to each of the top-side contacts, one at a time, in sequence. Switch 105 may be controlled by a counting circuit 106 supplied by generator 103, so that the first pulse is applied to contact 96, the second pulse is applied to contact 97, et cetera. The applied pulses are of the polarity that is not conducted readily by the good diode subunits. Hence, a sizable current flows only when the pulse is applied to a shorted subunit.

When a voltage pulse is applied to contact 99, an abnormally large current flows in the circuit, because of the existing short. This induces a relatively large voltage pulse in the secondary of transformer 104, which is transmitted through pulse-amplitude discriminator 107 to a memory unit 108. The memory unit is also controlled by the counting circuit 106, and it stores information as to the location of the shorted subunit. Inasmuch as innumerable types of memory units capable of performing the required functions are known to those skilled in the computer art, it is considered unnecessary to describe the memory unit further in this specification.

After the location of defective subunits has been found by test, in the manner described, a metal film 109 is deposited on top of the complex for connecting together all of the top-side contacts 96, 97, 98, 99 and 100, as shown in FIG. 11. The insulating, oxidized layer 101 prevents this film from shorting out any of the p-n junctions except the defective junction 94, which is already shorted by the contact 99, as hereinbefore described. Next, a photoresist 110 is applied on top of film 109, and all of the photoresist is exposed except the photoresist in the area over the defective subunit. For this purpose there is provided a cathode ray tube 111 having a conventional cathode 112, a control grid 113, beam deflection means 114, and a cathodoluminescent screen 115, which emits light from a point that is bombarded by the electron beam of the tube. A lens 116 focuses the light so emitted into a spot on the layer of photoresist 110.

Upon deflection of the electron beam in the cathode ray tube, by the conventional deflection circuits 117 connected to deflecting means 114, the spot of light emitted by screen 115 moves about upon the screen and causes the spot of light focused on photoresist 110 to move about on the surface of the photoresist, thereby exposing different areas of the photoresist, in sequence. A counting circuit 118, triggered by pulse generator 119, controls the deflection circuits 117, and also the memory unit 108, so that at each position of the spot of light on the surface of photoresist 110 the counting circuit commands the memory unit to read out the stored information as to whether the unit at that location is good or defective. At locations where the unit is defective, the memory unit supplies a negative pulse to the control grid 113 of the cathode ray tube, which cuts off the electron beam, so that that area of the photoresist is not exposed. Thus, all areas of the photoresist are exposed, except the area located over the defective subunit comprising junction 94 and contact 99.

The photoresist is the next developed in the conventional manner, which hardens the exposed photoresist covering all parts of metal film 109 except the areas over defective subunits. The unexposed photoresist is washed away, and a conventional etching solution is applied to etch the metal film 109 that is not protected by the exposed, developed and hardened photoresist. Thus, film 109 is removed from an area over the defective subunit and, if the etch is sufficiently strong, the metal contact 99 may be removed also. In any event, enough metal is removed to disconnect the defective subunit effectively from the nondefective subunits.

The layer of photoresist is then stripped off, to produce the final product illustrated schematically in FIG. 12. The hole in film 109 over the defective subunit, formed by the etching just described, is shown at 120. Thus, film 109 connects together only the good subunits of the diode, and an acceptable large-area diode is produced, even though in earlier steps of manufacture there was a defect that, prior to this invention, would have necessitated rejection.

In general, the gain in yield provided by this invention increases as the number of subunits into which the complex is divided becomes greater. However, even with a relatively small number of subunits, the advantages are significant.

For example, consider the case of the complex illustrated in FIGS. 1 and 2. Assume that at least three good subunits of the size chosen are needed to handle the power specified for the completed complex. Further, assume that the probability of there being a short in any particular subunit of this size is 50%. If the complex is fabricated of only three subunits, so that all must be good to produce an acceptable complex, then only 12.5% of the complexes manufactured will be acceptable, and it will be necessary to make 800 to get 100 that can be used. The probability would be about the same if the device were not divided into the subunits, but were fabricated as a single unit having the same junction area as three subunits in parallel, assuming that the probability of a defect being included in the junction is proportional to its area.

Using principles of this invention, however, still assuming that there must be at least three good subunits in the complex and that the probability of any one subunit being defective is 50%, the fabrication of a complex of four subunits and selection of the best three, as herein disclosed, raises the probability of obtaining an acceptable complex from 12.5% to 31.3%. Under the same assumptions, if there are five subunits in the complex, as illustrated, the probability of acceptance is raised to 50%, and only 200 complexes need be manufactured to get 100 than can be used.

If the number of subunits is doubled, and the junction areas of each subunit cut in half, the number of subunits required to proved a given overall junction area will be doubled, but the probability of a defect being found in any particular subunit will be reduced. Assuming now that the minimum number of good subunits needed is six, but that the probability that any particular subunit will be good has been increased to 70.7%, the probability that the complex will be acceptable is still only 12.5% if the complex is initially fabricated with just the minimum number of subunits, i.e., six, and all must be good. But if seven subunits are included in the complex, and the best six chosen, the odds on obtaining an acceptable complex are raised to 34.5%. If eight subunits are made and the best six selected, the odds on acceptance are raised to 56.9%. Thus, generally, the larger the number of subunits, the greater the gain from each additional subunit, even though the subunits are of smaller size.

In the structure of FIGS. 7, 8 and 9, assuming that there is only a 25% probability that any two subunit transistors will have sufficiently identical characteristics to meet the specifications, it will be necessary to make 400 pair to get 100 pair that can be used if only the minimum two transistors required are formed in each complex. By adding a third transistor and selecting the two that match most closely, the yield of acceptable complexes is increased from 25% to 57.8%, and the number that must be made to get 100 that can be used is reduced from 400 to 173. In this case also, the advantages increase as the number of units increases. Thus, if a solid-state circuit is to be fabricated containing, for example, ten similar transistors within the same body, the yield will be increased spectacularly by the inclusion of an eleventh transistor and the selection of the best ten.

In its broader aspects this invention is not limited to the specific examples herein illustrated and described, and it is intended that the following claims shall cover all variations and modifications embodying the inventive principles herein disclosed.

What is claimed is:

1. A transistor complex containing a plurality of transistors fabricated in a single body of semiconductor material, at least one of which transistors being defective, which comprises a body of semiconductor material, the bulk of said body being a collector of one conductivity type, said body containing a plurality of base layers of the opposite conductivity type with a surface of each exposed at a first surface of said body, said base layers being contiguous to said collector, said body also containing a plurality of emitter layers of the same conductivity type as said collector with a surface of each exposed at the said surface of the body, each of said emitter layers being contiguous to one of said base layers and separate from one another, and at least one of said transistors being defective, an insulative layer intimately overlying the surface of said body with openings therein exposing the respective surface of said emitter and base layers, a pair of conductors intimately overlying said insulative layer and each having respective discrete leads connected to said emitter and base layers through said openings, with the lead connection to at least one of the emitter and base layers of said defective transistor being broken for isolating said defective transistor from said non-defective transistors.

2. The transistor complex of claim 1 further defined by said base layer being divided into a plurality of base regions, separated and isolated from each other by said collector, the emitter layers being contiguous to different ones of said regions, and the base regions of said defective units being isolated and separated from the non-defective units by the bulk of said body.

3. The transistor complex of claim 2 further defined by leads interconnecting a plurality of said base layers of the non-defective units.

References Cited by the Examiner

UNITED STATES PATENTS

| | | | |
|---|---|---|---|
| 2,399,753 | 5/1946 | McLarn | 29—155.5 |
| 2,721,965 | 10/1955 | Hall | 317—235 |
| 2,895,106 | 7/1959 | Taunt | 324—51 X |
| 2,981,877 | 4/1961 | Noyce | 317—235 |
| 3,028,659 | 4/1962 | Chow et al. | 340—166 X |
| 3,141,107 | 7/1964 | Wasserman | 324—103 |
| 3,214,654 | 10/1965 | Armstrong et al. | 317—234 X |
| 3,226,603 | 12/1965 | Finn et al. | 317—234 X |

FOREIGN PATENTS

| | | |
|---|---|---|
| 1,071,233 | 12/1959 | Germany. |
| 595,853 | 12/1947 | Great Britain. |

R. F. POLISSACK, *Assistant Examiner.*

JOHN W. HUCKERT, *Primary Examiner.*